United States Patent
Simons et al.

(10) Patent No.: US 10,564,248 B1
(45) Date of Patent: Feb. 18, 2020

(54) TUNABLE MULTI-TONE MULTI-BAND HIGH-FREQUENCY SYNTHESIZER FOR SPACE-BORNE BEACON TRANSMITTER FOR ATMOSPHERIC RADIO WAVE PROPAGATION STUDIES

(71) Applicant: U.S.A., as represented by the Administrator of the National Aeronautics and Space Administration, Washington, DC (US)

(72) Inventors: Rainee Simons, Cleveland, OH (US); Edwin Wintucky, Cleveland, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 624 days.

(21) Appl. No.: 14/922,306

(22) Filed: Oct. 26, 2015

Related U.S. Application Data

(60) Provisional application No. 62/068,163, filed on Oct. 24, 2014.

(51) Int. Cl.
*G01S 1/04* (2006.01)
*H03L 7/20* (2006.01)

(52) U.S. Cl.
CPC .............. *G01S 1/042* (2013.01); *H03L 7/20* (2013.01)

(58) Field of Classification Search
CPC ........ G01S 1/042; G01S 11/10; G01S 13/586; H03L 7/20; H04B 10/11; H04B 1/69;
(Continued)

(56) References Cited

U.S. PATENT DOCUMENTS 3,108,225 A * 10/1963 Midkiff ................ H03G 1/0035
455/249.1
3,430,237 A * 2/1969 Allen ....................... H04B 7/01
342/84

(Continued)

FOREIGN PATENT DOCUMENTS

| JP | 2007266654 A | * | 10/2007 | ............. H04B 10/00 |
| JP | 2008193721 A | * | 8/2008  | ............. H04B 1/005 |

OTHER PUBLICATIONS

Nicolas K Fontaine, Characterization of Dual-Electrode Mach-Zehnder Modulator Based Optical Frequency Comb Generator in Two Regimes, pp. 186-187, IEEE (2008).

*Primary Examiner* — Vladimir Magloire
*Assistant Examiner* — Nuzhat Pervin
(74) *Attorney, Agent, or Firm* — Robert H. Earp, III; William M. Johnson

(57) ABSTRACT

A multi-tone multi-band tunable millimeter-wave synthesizer is provided. In some embodiments, the multi-tone multi-band tunable millimeter-wave synthesizer is configured to simultaneously generate multiple frequency tones for space-borne beacon transmitter for atmospheric radio wave propagation studies. The apparatus includes a comb generator, which puts out evenly spaced harmonic frequencies of the input signal, which are coherent, tunable, and the number of tones or combs is scalable over a wide range of frequencies. These harmonics or tones are amplified to the power level needed for radio wave propagation studies. The amplified signals are transmitted as beacon signals from a satellite to a ground receiving station.

20 Claims, 17 Drawing Sheets

(58) Field of Classification Search
CPC .......... H04B 1/7163; H04B 7/01; G02F 2/02; H04L 27/06; H04L 25/0305; G02B 6/2861; G02B 6/4215; H03B 5/1841; H03C 3/40; H01P 1/218; H01P 1/20; H03G 1/0035; H03F 1/0261
USPC ........................................................ 342/385
See application file for complete search history.

(56) References Cited

U.S. PATENT DOCUMENTS

| | | | | |
|---|---|---|---|---|
| 3,435,344 | A * | 3/1969 | Blair | G01S 13/586 |
| | | | | 455/265 |
| 4,797,677 | A * | 1/1989 | MacDoran | G01S 11/10 |
| | | | | 342/352 |
| 5,508,661 | A * | 4/1996 | Keane | H01P 1/218 |
| | | | | 327/105 |
| 6,901,224 | B1 * | 5/2005 | Davis | G02B 6/4215 |
| | | | | 398/202 |
| 8,077,797 | B2 * | 12/2011 | Sorrells | H03C 3/40 |
| | | | | 375/256 |
| 8,476,979 | B1 * | 7/2013 | Simons | H03F 1/0261 |
| | | | | 330/207 P |
| 2002/0145475 | A1 * | 10/2002 | Fenton | H03B 5/1841 |
| | | | | 331/25 |
| 2003/0090767 | A1 * | 5/2003 | Yap | G02B 6/2861 |
| | | | | 398/183 |
| 2004/0166817 | A1 * | 8/2004 | Mokhtari | H04L 27/06 |
| | | | | 455/91 |
| 2004/0264977 | A1 * | 12/2004 | Yap | G02F 2/02 |
| | | | | 398/161 |
| 2005/0041746 | A1 * | 2/2005 | Rosen | H04B 1/7163 |
| | | | | 375/242 |
| 2005/0084032 | A1 * | 4/2005 | Rosen | H04B 1/7163 |
| | | | | 375/295 |
| 2005/0084033 | A1 * | 4/2005 | Rosen | H04B 1/69 |
| | | | | 375/295 |
| 2006/0232363 | A1 * | 10/2006 | Reynolds | H01P 1/20 |
| | | | | 333/202 |
| 2009/0237289 | A1 * | 9/2009 | Stoddard | H04K 3/28 |
| | | | | 342/14 |
| 2013/0182620 | A1 * | 7/2013 | Chaffee | H04B 10/11 |
| | | | | 370/310 |
| 2016/0065313 | A1 * | 3/2016 | Yu | H04L 25/0305 |
| | | | | 398/208 |

* cited by examiner

TUNABLE MULTI-TONE MULTI-BAND HIGH-FREQUENCY SYNTHESIZER FOR SPACE-BORNE BEACON TRANSMITTER FOR ATMOSPHERIC RADIO WAVE PROPAGATION STUDIES

CROSS-REFERENCE TO RELATED APPLICATION

This application claims the benefit of U.S. Provisional Patent Application No. 62/068,163, filed on Oct. 24, 2014, the subject matter of which is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

FIELD

The present invention relates to a multi-tone multi-band synthesizer and, more particularly, to a tunable multi-tone multi-band millimeter-wave synthesizer for application in a space-borne beacon transmitter for investigating radio wave propagation through the Earth's atmosphere.

BACKGROUND

Because of increasing congestion in the currently used microwave spectrum (3-30 GHz) for space-to-Earth communications there is a study underway to develop the multi-GHz bandwidth available at millimeter-wave frequencies above 30 GHz. The millimeter-wave frequency bands of interest include Q-band (37-43 GHz) and E-band (71-76 GHz and 81-86 GHz). Prior to the use of these millimeter-wave frequency bands it is necessary to characterize the many atmospheric effects, including rainfall, cloud coverage and gaseous adsorption on millimeter-wave signals. For high data rate wide band millimeter-wave communication systems it is also necessary to characterize the frequency-dependent group delay effects. The design of any operational millimeter-wave communication system will depend on the results of the propagation studies.

However, in conventional low frequency satellite borne microwave beacon transmitter used in the investigation of Earth's atmosphere on radio wave propagation from space, the frequency of the beacon is fixed at a single frequency. A major limitation of conventional beacon transmitter or approach is that it assumes that the atmospheric attenuation and group delay effects are constant at all frequencies across the narrow frequency band of interest. However, at millimeter-wave frequencies the atmospheric attenuation and group delay effects are not constant at all frequencies across the band of interest. Hence, measurements have to be made at multiple frequencies across the entire multi-GHz wide frequency band of interest. Sequentially stepping the frequency of the beacon transmitter in small discrete increments is also not an option, since in the time interval between frequency increments, transmission, and measurements; the characteristics of the atmosphere could drastically change. Hence, in the new tunable satellite borne beacon transmitter, which is based on the multi-tone multi-band millimeter-wave synthesizer described here, multiple frequency tones that are coherent and representative of the desired Q-band and E-band frequencies of interest are simultaneously generated and transmitted. Thus, the new beacon transmitter enables simultaneous, fast, more accurate wide band characterization of radio wave propagation from space through the Earth's atmosphere. Besides radio wave propagation studies, the multi-tone frequency synthesizer can be used for space borne active remote sensors like scatterometers, which require coherent, highly stable multi frequency signals.

SUMMARY

Certain embodiments of the present invention may provide solutions to the problems and needs in the art that have not yet been fully identified, appreciated, or solved by conventional low microwave frequency beacon transmitters. For instance, one or more embodiments of the present invention pertain to a tunable multi-tone, multi-band, millimeter-wave solid-state or semiconductor diode based synthesizer or frequency comb generator (FCG) or harmonic generator for application in a satellite-borne beacon transmitter for radio wave propagation studies through the Earth's atmosphere. In some embodiments, a tunable semiconductor diode laser coupled with an optical modulator and a RF input signal source or low temperature superconducting Josephson tunnel junctions based microwave electronics coupled with a sinusoidally varying magnetic field source could be utilized instead of the millimeter-wave semiconductor diodes for a synthesizer or frequency comb generator (FCG) or harmonic generator.

In one embodiment, an apparatus is provided. The apparatus includes a tunable millimeter-wave frequency comb generator (FCG), which puts out evenly spaced harmonic frequencies of the input signal, which are coherent, tunable, and number of combs is scalable over a wide range of millimeter-wave frequencies. These harmonics or tones are then filtered by a tunable bandpass filter and amplified by a tunable millimeter-wave power amplifier to the power level needed for radio wave propagation studies. The amplified signals are transmitted as beacon signals from a satellite to a ground receiving station.

In another embodiment, an apparatus is provided. The apparatus includes a tunable diode laser operating at about 1550 nanometer wavelength, optical modulator, RF signal source, RF phase shifter, RF drive amplifiers, high-speed photodiode, tunable bandpass filter, and tunable millimeter-wave power amplifier. The tunable diode laser, optical modulator, RF signal source, RF phase shifter, and RF drive amplifier could be configured into an optical frequency comb generator (FCG). The output of the optical frequency comb generator could be used to generate millimeter-wave beacon signals. Coupling the optical emission from the optical comb generator to a high-speed photodiode does this. The nonlinearity of the high-speed photodiode voltage-current characteristics generates a beat signal between any two tones emitted by the comb generator. The beat signals, which are in the millimeter-wave frequency band of interest (Q-band and E-band) could be filtered by a tunable bandpass filter and amplified by a tunable millimeter-wave power amplifier. The amplified signals could then be transmitted as beacon signals from a satellite to a ground station. Compared to conventional microwave beacon transmitters, which are bulky and expensive, the above approach is very compact, lightweight, and low cost.

In yet another embodiment, an apparatus is provided. The apparatus includes a low temperature superconducting extended Josephson tunnel junction based microwave electronics, which is driven by an in-plane tunable externally applied and sinusoidally oscillating magnetic field or flux source. The output from the junction is a train or equally spaced comb-like voltage pulses. Fourier transform of the voltage pulses show that they contain hundreds of harmonics or tones of the original driving sinusoidal magnetic field frequency, which are coherent and include the higher Q-band and E-band millimeter-wave frequencies of interest. To increase the output power a linear array of N identical Josephson tunnel junction devices could be built. The Josephson junction array and the externally applied sinusoidally oscillating magnetic flux source could be configured as a superconducting frequency comb generator (FCG). The output power of the array then scales as $N^2$. The superconducting frequency comb generator circuit could be coupled via a transmission line to a tunable bandpass filter to filter out the desired frequencies. A tunable millimeter-wave power amplifier could amplify these frequencies to the desired level. The amplified signals could then be transmitted as beacon signals from a satellite to a ground station. The advantage of the above approach is that the entire circuit can be built on a chip and hence very compact, lightweight, and low cost. A second advantage is that the natural cold environment of space could provide the necessary cooling for the superconducting extended Josephson tunnel junction array, thus lowering the DC power consumption onboard the satellite and thus increasing the overall system efficiency.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
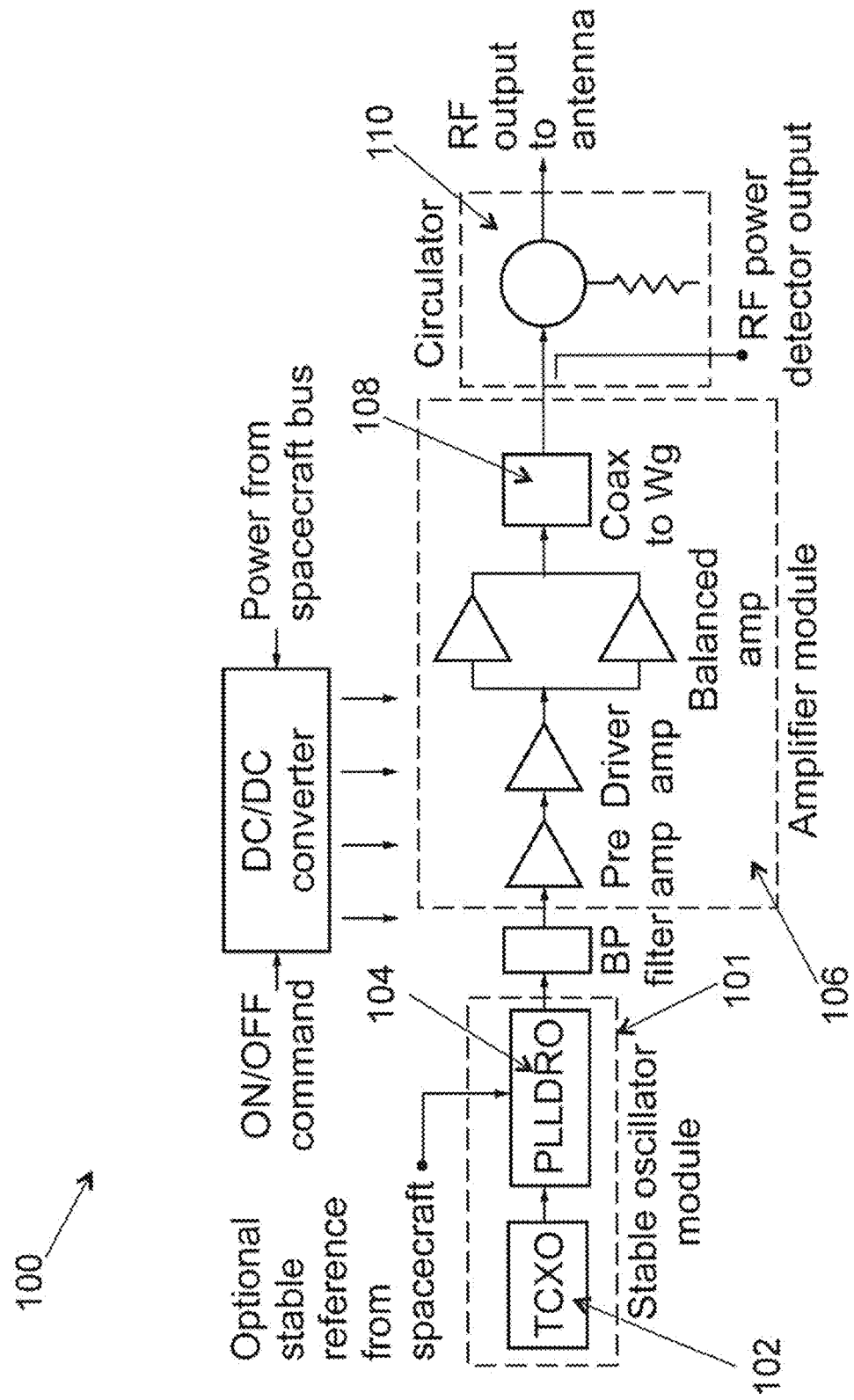
FIG. 1 is a schematic illustrating a conventional fixed single frequency satellite borne microwave beacon transmitter configuration.

FIG. 1 is a schematic 100 illustrating a conventional fixed single frequency satellite borne microwave beacon transmitter configuration. The conventional beacon transmitter configuration may include a microwave signal source 101 configured to generate a fixed single frequency signal. Because the frequency spectrum is divided into bands, signals operating in 18.0 to 26.5 Gigahertz (GHz) are known as K-band signals, signals operating in 33-50 GHz are known as Q-band signals, signals operating in 60-90 GHz are known as E-band signals. The generation of the un-modulated or continuous wave (CW) fixed single frequency microwave carrier takes place in the phased locked loop (PLL) stabilized dielectric resonator oscillator (DRO) 104, which derives its input reference from a highly stable temperature compensated crystal oscillator (TCXO) 102. A chain of monolithic microwave integrated circuit (MMIC) based amplifiers consisting of a pre amp, driver amp and a balanced power amp (PA) 106 boosts the output of the DRO to the desired power level. The output of the PA is coupled via a coax-to-waveguide transition 108 and a circulator 110 to a transmitting antenna, such that the amplified signal can be transmitted to a receiving station on Earth. Circulator 110 also couples any reflections from the antenna to a match load. Also, a RF power detector monitors the amount of power that the beacon outputs from amplifier 106.

As the demand for satellite communication services at higher millimeter-wave frequency increases, the development of a new transmitter configuration based on existing fixed single frequency beacon transmitter design becomes a challenge. This is because at higher millimeter-wave frequencies, DROs do not function efficiently due to the smaller dimensions and thus introduces a manufacturing challenge. Instead of building a new beacon source each time the demand for higher millimeter-wave frequency arises, a beacon configuration based on a multi-tone multi-band frequency synthesizer, which exploits the discrete frequency spectrum produced by a millimeter-wave solid-state frequency comb generator (FCG) may be beneficial. Unlike the conventional fixed single frequency beacon source, the multi-tone multi-band frequency synthesizer is capable of simultaneously delivering coherent multiple millimeter-wave frequencies. These multiple frequencies enable simultaneous characterization of the frequency dependent attenuation and group delay effects, which are essential for the design of multi-Gbps data rate ultra wide band millimeter-wave satellite communication links.

Figure 2:
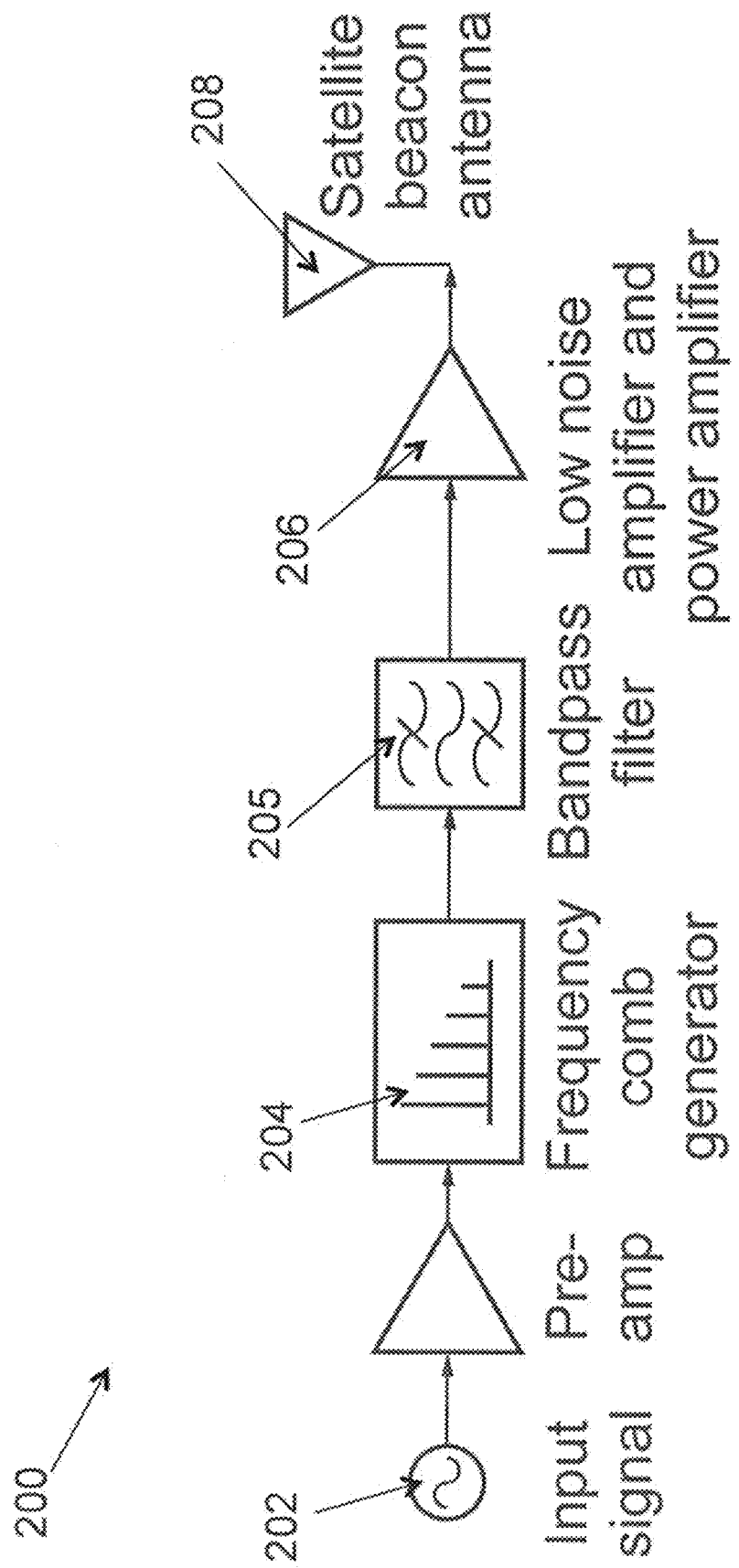
FIG. 2 is a schematic illustrating a basic tunable multi-tone frequency synthesizer based on a millimeter-wave frequency comb generator (FCG) for a beacon transmitter payload for radio wave propagation experiments.

FIG. 2 is a schematic 200 illustrating a basic multi-tone frequency synthesizer based beacon transmitter that could fly on a geostationary satellite as a hosted payload for radio wave propagation experiments at millimeter-wave frequencies. In this embodiment, the synthesizer consists of a millimeter-wave frequency comb generator 204, which puts out evenly spaced harmonic frequencies or tones of the input signal 202, which are coherent and tunable over a wide frequency range. In one example, if the input signal source 202 is tuned to 1.0 GHz and drives the frequency comb generator 204, then the generated harmonics or tones at the output of the frequency comb generator are evenly spaced by 1.0 GHz. If the input signal source 202 is tuned to 0.5 GHz, then the generated harmonics or tones are evenly spaced by 0.5 GHz. Thus instantly doubling the number of harmonics or tones within a given band of interest. The bandpass filter 205 filters out the desired frequencies of interest. The amplifier chain 206 then amplifies these harmonics to the power level needed for radio wave propagation studies. It would be appreciated by a person of ordinary skill in the art that the advantage of this approach or configuration is that for a given frequency band of interest, the design is flexible enough to accommodate any number of harmonics or tone within the band. See, for example, FIG. 5 and FIG. 6, which show the number of harmonics or tones within the given 18.5 to 22.5 GHz frequency band.

It should be appreciated by a person of ordinary skill in the art that the input signal source 202, the center frequency and bandwidth of the bandpass filter 205, the amplifier chain 206 and the antenna 208 could be electronically tuned or reconfigured on orbit to accommodate a change in the number and frequency of the harmonics or tones and the desired beacon output power by commanding the satellite from ground. In addition, the beacon transmitter can be turned ON or OFF by commanding the satellite from ground.

Harmonics or tones that are amplified are simultaneously transmitted as beacon signals by antenna 208 from space to several receiving ground stations located at several vastly different climate zones within the CONUS. By measuring the signal relative strength and phase at ground sites over an extended period of time spanning several years one can statistically estimate the attenuation and group delay or dispersion due to atmospheric induced effects. It should be appreciated by a person of ordinary skill in the art that signals at the upper Q-band and E-band millimeter-wave frequencies would experience much higher attenuation during rain fades than signals at the lower K-band microwave frequencies. Consequently, the signal-to-noise ratio (SNR) at the K-band ground receivers could be higher or better than the Q-band or E-band ground receivers.

Figure 3:
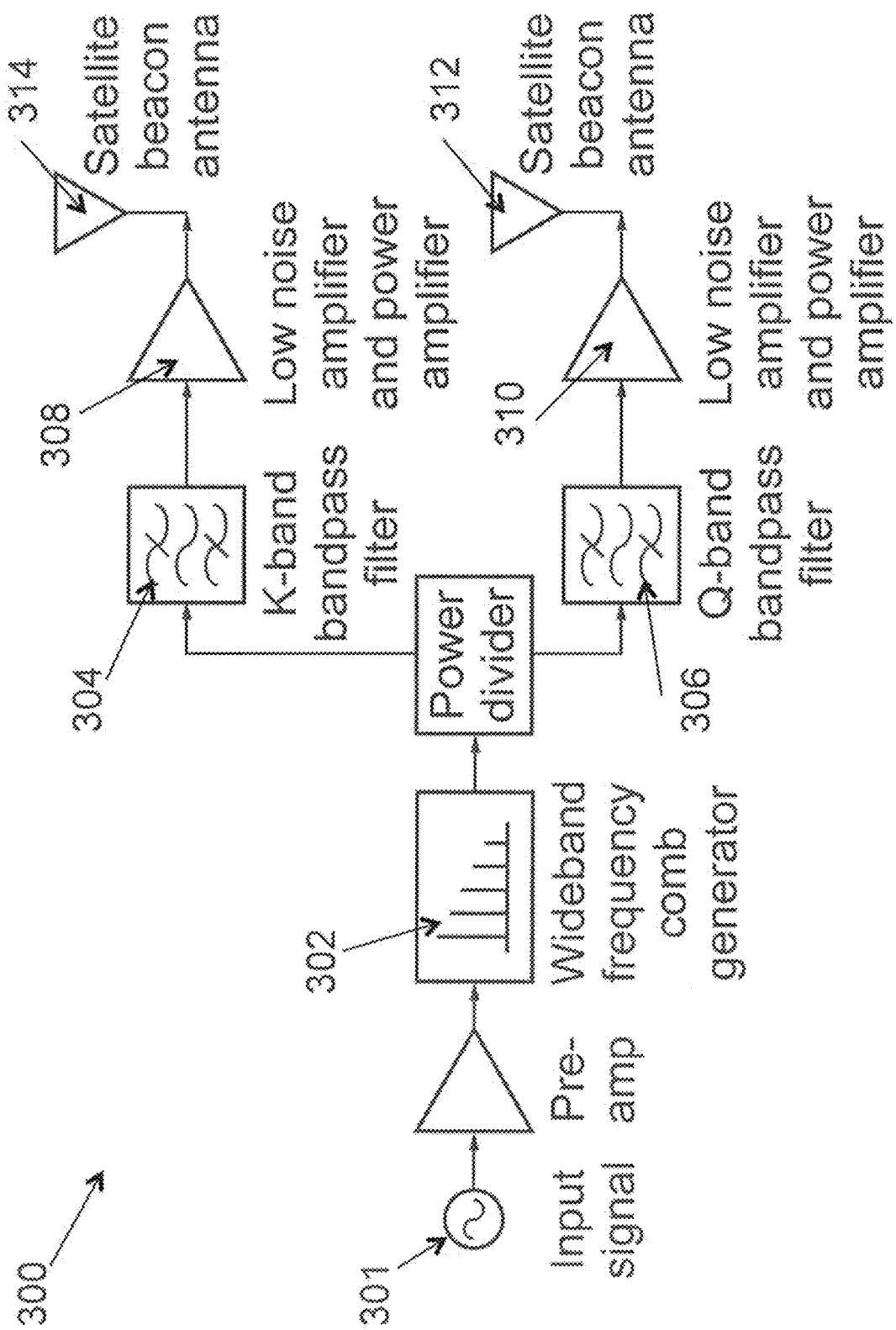
FIG. 3 is a schematic illustrating a tunable multi-tone multi-band frequency synthesizer based on a millimeter-wave frequency comb generator (FCG) for a beacon transmitter payload for radio wave propagation experiments.

FIG. 3 is a schematic 300 illustrating a tunable multi-tone multi-band frequency synthesizer according to an embodiment of the present invention. The multi-bands are K-band and either Q-band or E-band or a combination of both Q-band and E-band signals. In the description below this combination is indicated as Q-band/E-band. In this embodiment, the synthesizer consists of a high frequency wideband solid-state frequency comb generator 302. A person of ordinary skill would appreciate that the frequency comb generator can be manufactured using step recovery diodes (SRDs). Furthermore, it would be appreciated by a person of ordinary skill that the material for manufacturing the step recovery diodes can be silicon (Si) or III-V compound semiconductors such as gallium arsenide (GaAs) or wide band gap semiconductors such as silicon carbide (SiC) or gallium nitride (GaN). The frequency comb generator receives its input from a RF signal source 301 and generates evenly spaced harmonic frequencies or tones of the input signal 301, which are coherent and tunable over a wide frequency range. The K-band and Q-band/E-band harmonics that are generated are filtered out by bandpass filters 304 and 306 and amplified by the amplifier chain 308 and 310 to the power level required for radio wave propagation studies. The frequency separation between the harmonics or tones can be tuned or reconfigured by changing the frequency of the RF signal source 301. The amplified multi-tone multi-band signals are simultaneously transmitted through antennas 312 and 314 from space to ground.

It should be appreciate by a person of ordinary skill in the art that the Q-band/E-band ground receiver signal-to-noise ratio could become very poor during deep fades caused by weather related changes in the atmosphere. The poor signal-to-noise ratio could cause the ground receivers to lose frequency and or phase lock. Consequently, no measurement of the attenuation and group delay can be performed. According to an embodiment of the present invention the multi-tone multi-band beacon configuration in FIG. 3 is capable of overcoming this problem by including a coherent K-band (18 to 26.5 GHz) beacon source along with the Q-band/E-band beacon sources on the satellite payload. Because of K-band ground receiver could have higher signal-to-noise ratio it could retain frequency/phase lock during deep fades and thus enable high availability attenuation and group delay measurements or characterization. This data is valuable and can provide a reference for model development and also provide an understanding of frequency model scaling factors for future system design when Q-band/E-band propagation data is unavailable.

It should be appreciated by a person of ordinary skill in the art that the that the input signal source 301, the center frequency and bandwidth of the bandpass filters 304 and 306, the amplifier chains 308 and 310 and the antennas 312 and 314 could be electronically tuned or reconfigured on orbit to accommodate a change in the number and frequency of the harmonics or tones and the desired beacon output power by commanding the satellite from ground. In should also be appreciated by a person of ordinary skill in the art that during normal operation both K-band as well as Q-band/

E-band circuits of the beacon transmitter are turned ON. However, by commanding the satellite from ground either the K-band circuit or the Q-band/E-band circuit or both K-band and Q-band/E-band circuits could be turned OFF.

Figure 4:
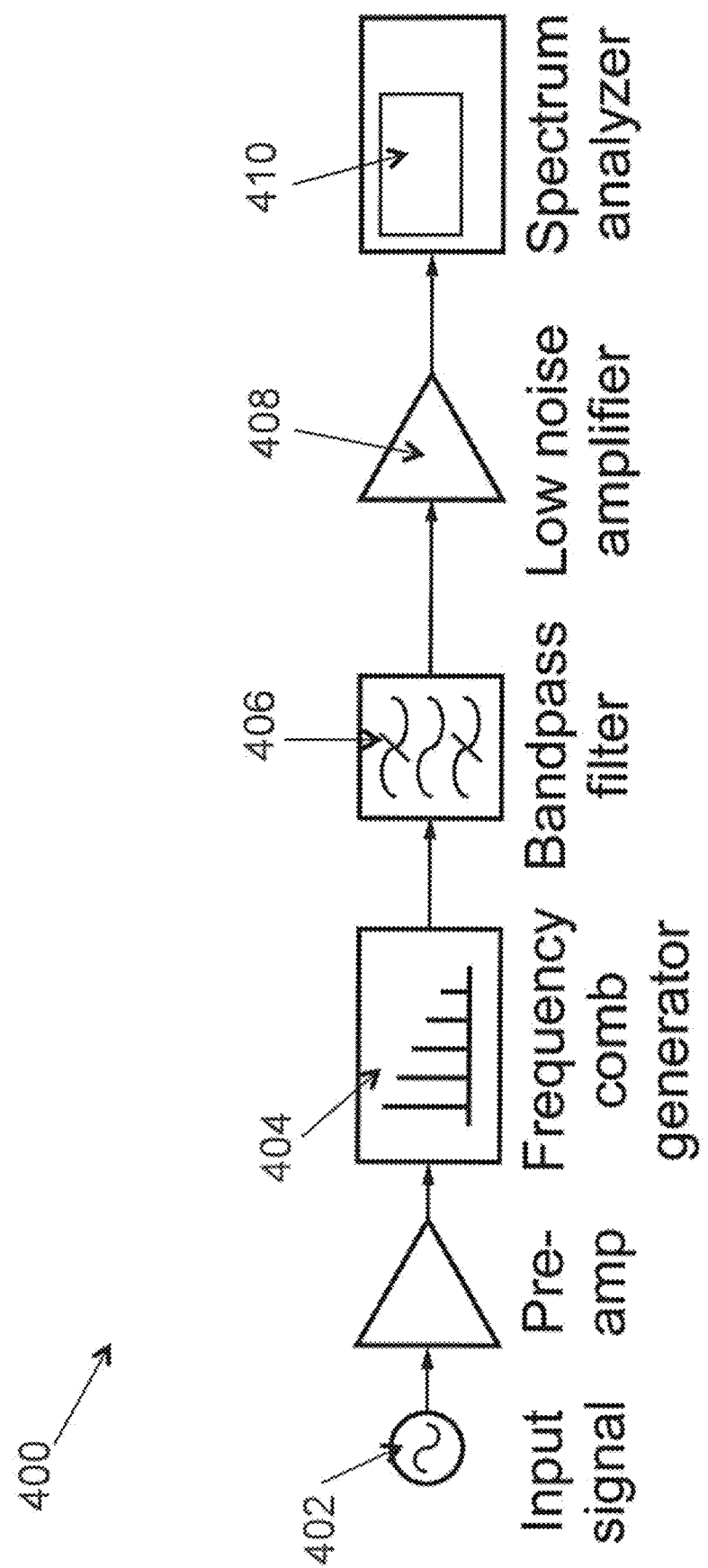
FIG. 4 is a schematic illustrating a test setup for measuring the frequency and output power of the tunable harmonics or multi-tones at K-band and Q-band frequencies.

FIG. 4 is a schematic 400 illustrating a test setup at K-band and Q-band for the measurement of the multi-tone multi-band frequency synthesizer output frequency and power according to an embodiment of the present invention. The bandpass filters 406 and amplifier chain 408 are appropriately selected for the two frequency bands in this embodiment. The separation or spacing between the tones can be tuned by changing the frequency of the input signal 402 to the frequency comb generator (FCG) 404. The spectrum analyzer 410 in the test setup of FIG. 4 is used to measure the frequency and output power of the multi-tones or harmonics.

In this example, the spectrum analyzer 410 can measure and also compare the frequency and output power of the multi-tones or harmonics. See, for example, FIGS. 5, 6, 7, and 8.

Figure 5:
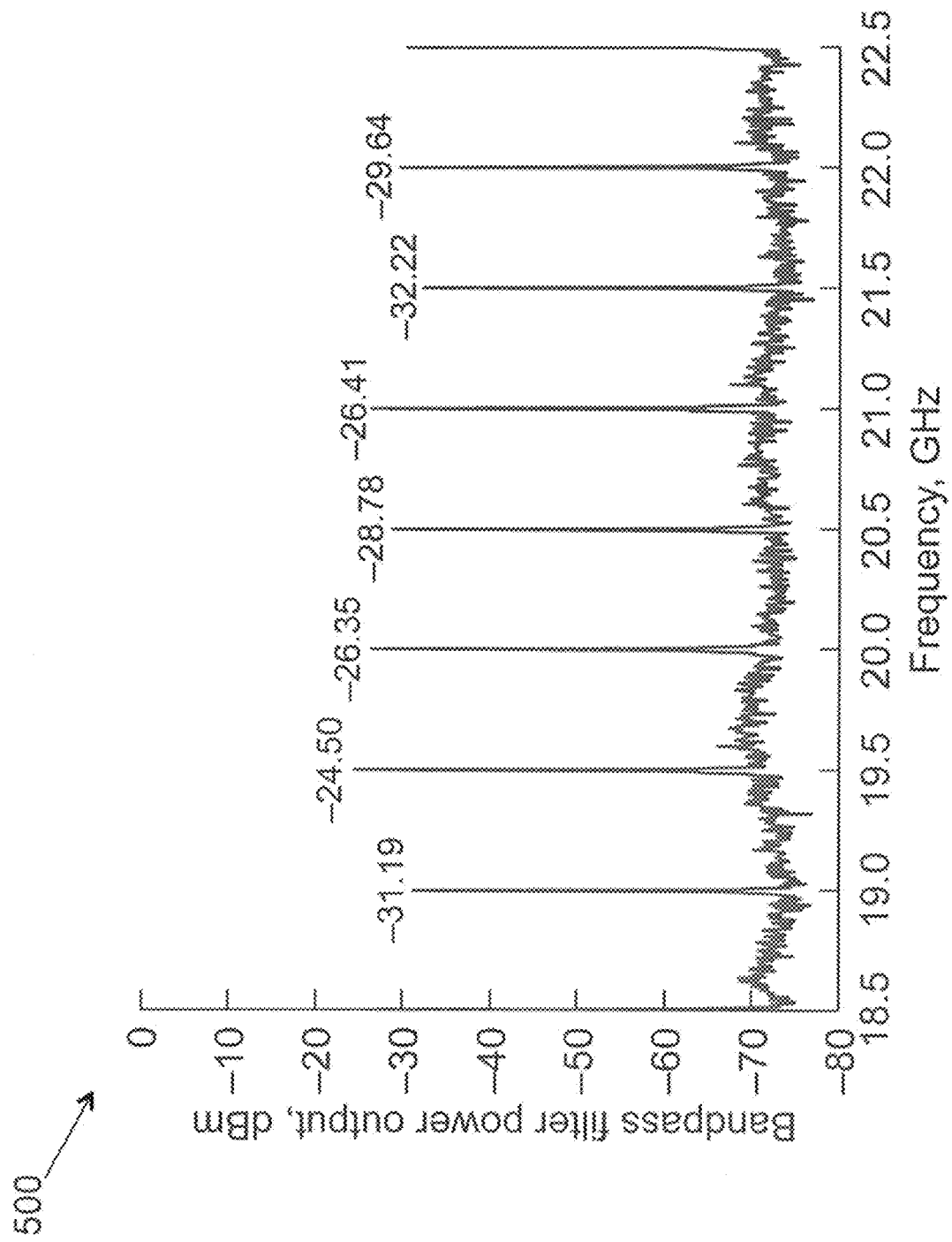
FIG. 5 is a graph illustrating K-band multi-tones at 0.5 GHz intervals or comb spacing as measured at the output of the bandpass filter. The output power level for each tone is indicated in dBm.
Figure 6:
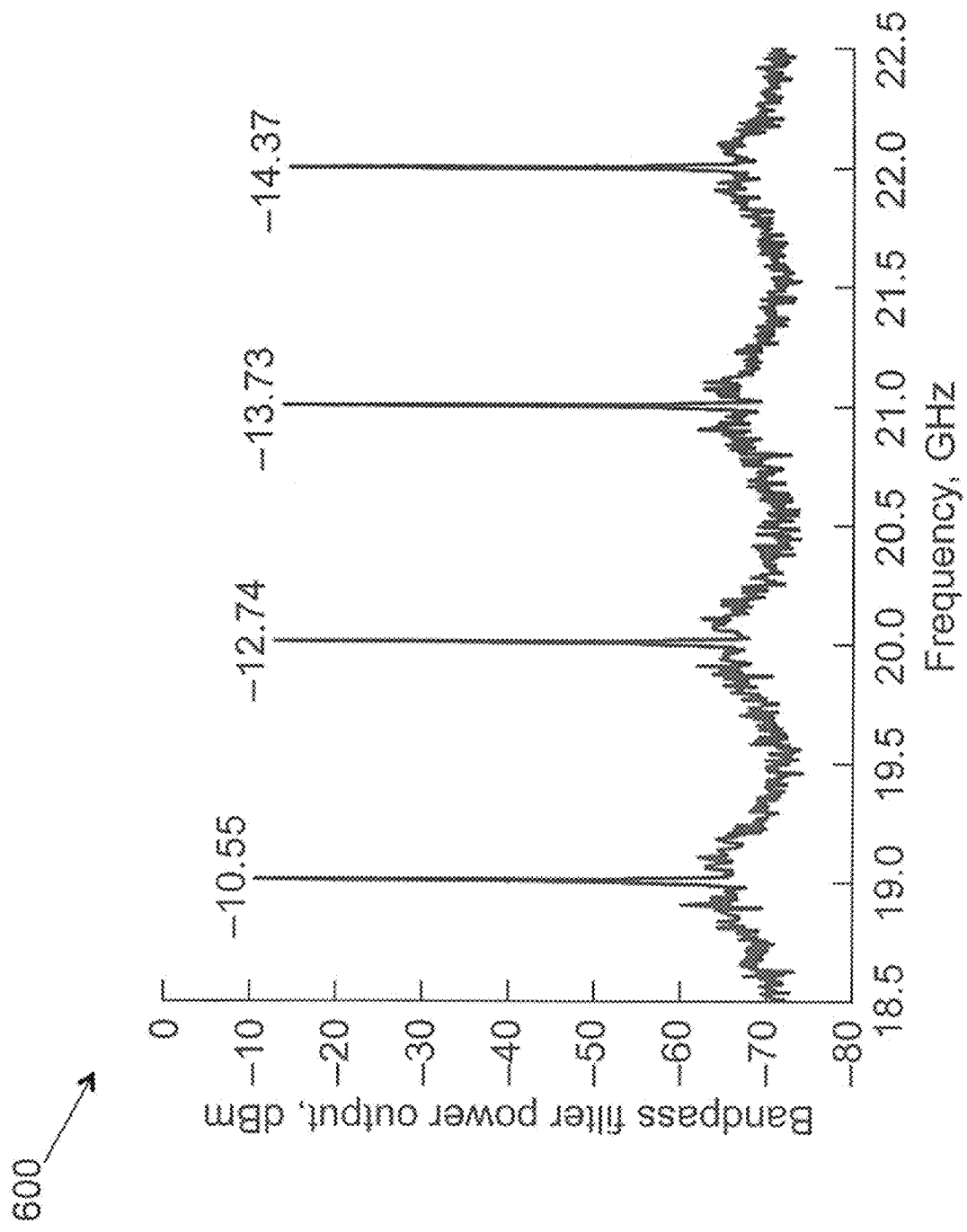
FIG. 6 is a graph illustrating K-band multi-tones at 1.0 GHz intervals or comb spacing as measured at the output of the bandpass filter. The output power level for each tone is indicated in dBm.
Figure 7:
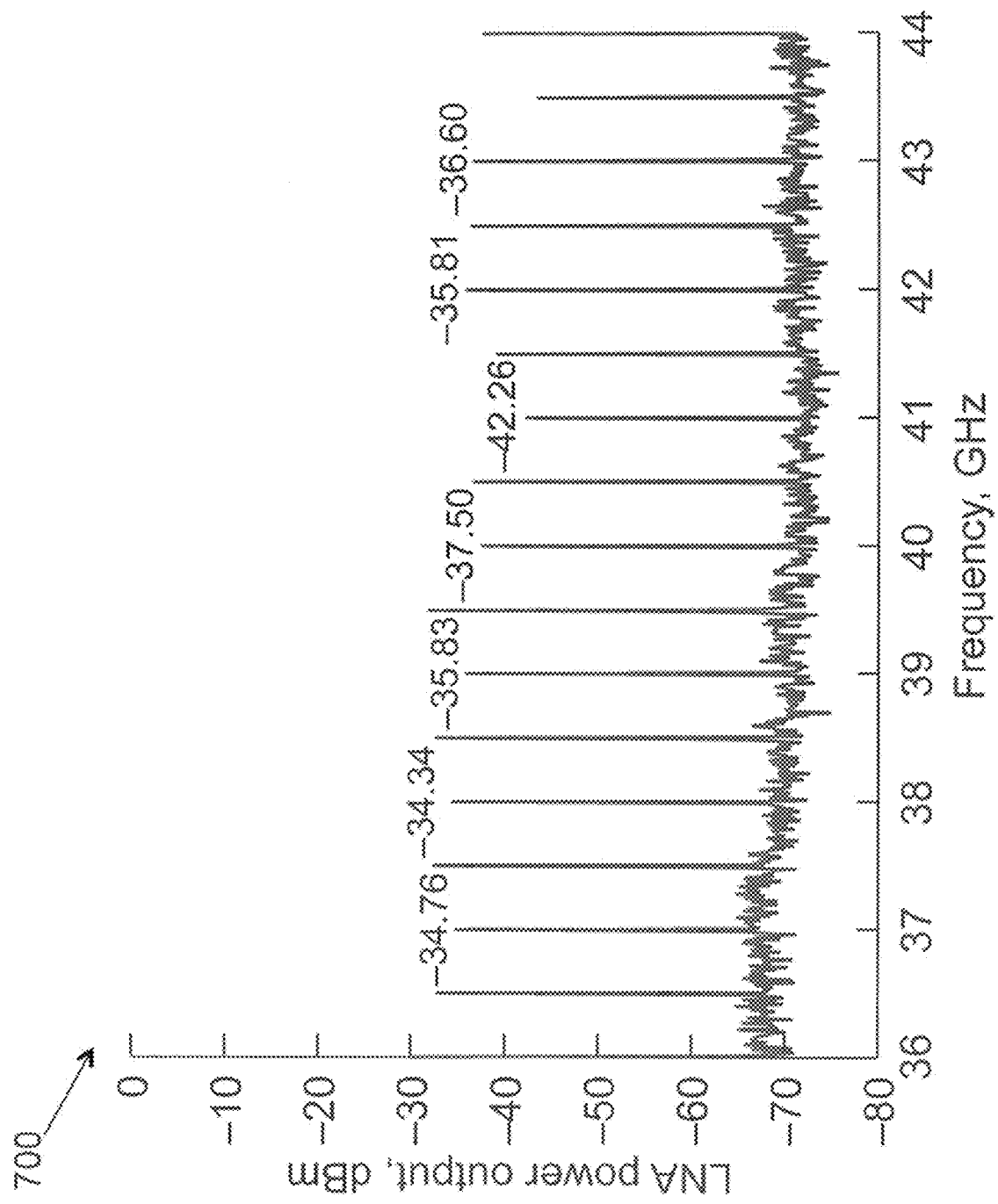
FIG. 7 is a graph illustrating Q-band multi-tones at 0.5 GHz intervals or comb spacing as measured at the output of the low noise amplifier. The output power level for each tone is indicated in dBm.
Figure 8:
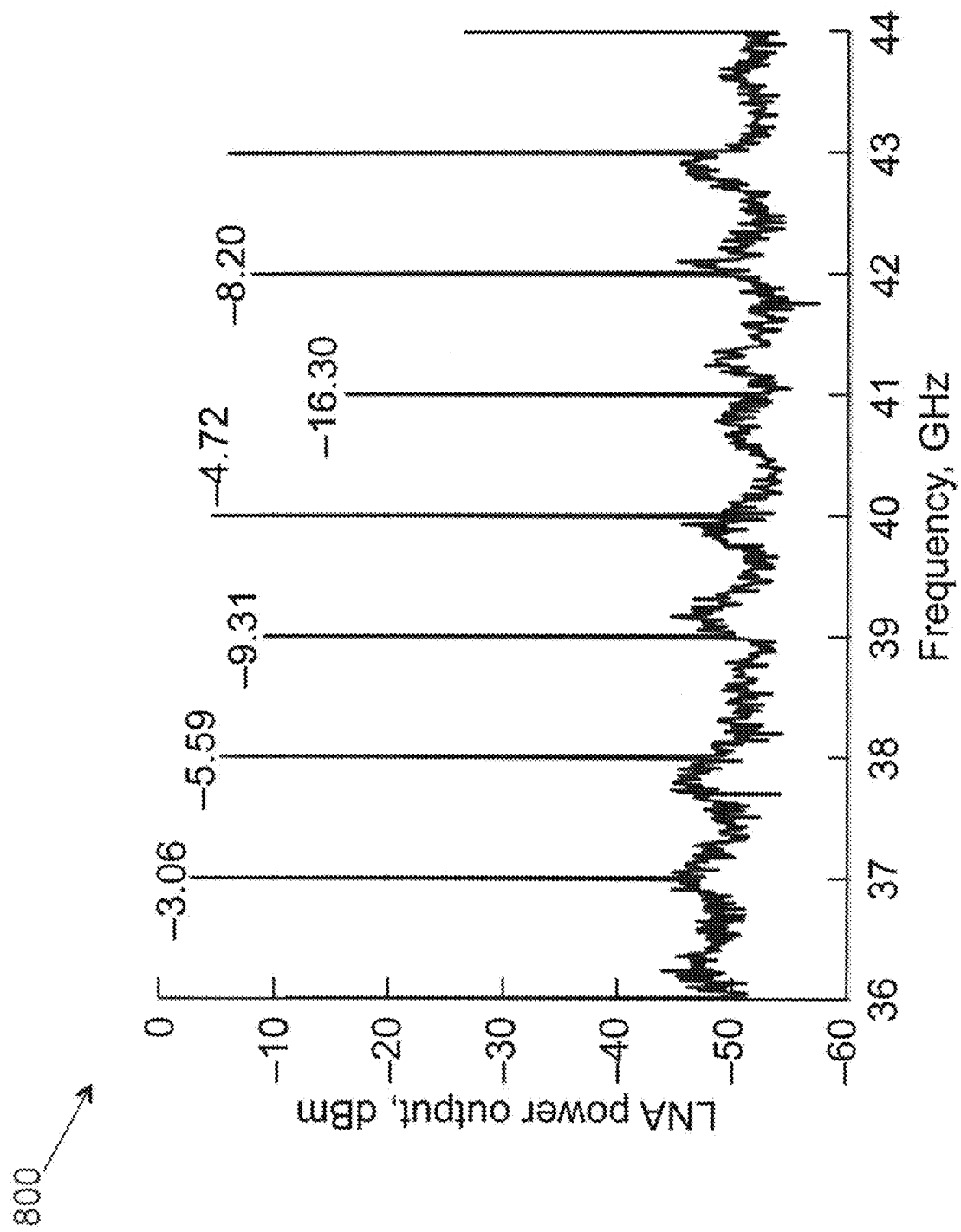
FIG. 8 is a graph illustrating Q-band multi-tones at 1.0 GHz intervals or comb spacing as measured at the output of the low noise amplifier. The output power level for each tone is indicated in dBm.

In FIG. 5, graph 500 shows the K-band multi-tones or harmonics at 0.5 GHz separation or spacing between the tones and their frequency and output power level. In FIG. 6, graph 600 shows the K-band multi-tones or harmonics at 1.0 GHz separation or spacing between the tones and their frequency and output power level. In FIG. 7, graph 700 shows the Q-band multi-tones or harmonics at 0.5 GHz separation or spacing between the tones and their frequency and output power level. In FIG. 8, graph 800 shows the Q-band multi-tones or harmonics at 1.0 GHz separation or spacing between the tones and their frequency and output power level. It should be appreciated that in this embodiment of the present invention, the output power in the tones is nearly the same. Hence, this embodiment generates a flat comb spectrum across the entire frequency band of interest. It should be appreciate by a person of ordinary skill in the art that as the number of tones or harmonics within the frequency band of interest increases the output power level of the tones or harmonics decreases. See, for example, FIGS. 7 and 8.

Figure 9:
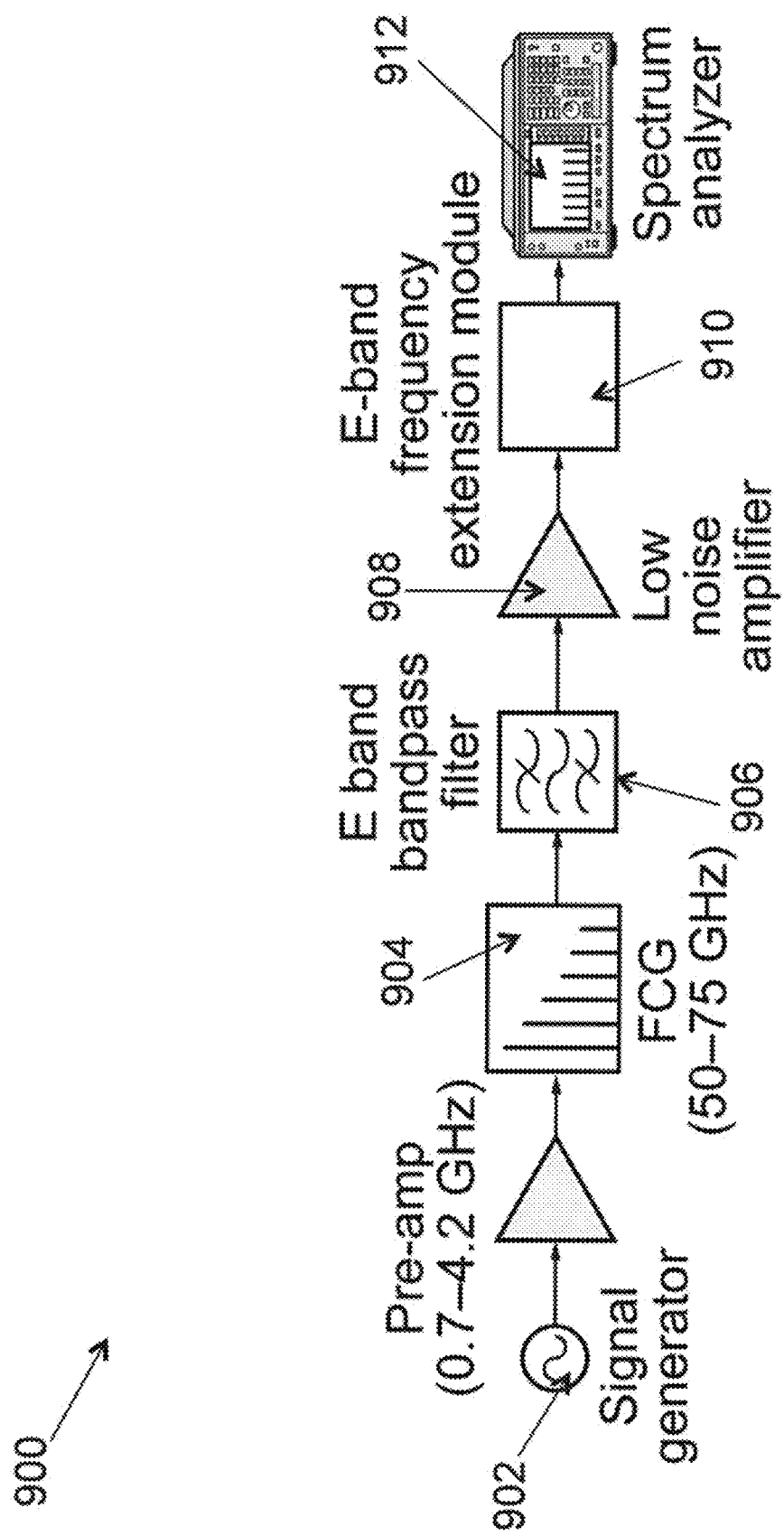
FIG. 9 is a schematic illustrating a test setup for measuring the frequency and output power of the tunable harmonics or multi-tones at E-band frequencies.

FIG. 9 is a schematic 900 illustrating a test setup at E-band for the measurement of the multi-tone multi-band frequency synthesizer output frequency and power according to an embodiment of the present invention. The separation or spacing between the tones can be tuned by changing the frequency of the input signal 902 to the frequency comb generator (FCG) 904. The bandpass filters 906 and amplifier chain 908 are appropriately selected for the frequency range in this embodiment. The test setup of FIG. 9 is used to measure the frequency and output power of the multi-tones or harmonics.

In this example, an E-band frequency extension module 910 consisting of a harmonic mixer and a diplexer are used to extend the frequency range of the spectrum analyzer 912. The spectrum analyzer 912 can measure and compare the frequency and output power of the multi-tones. See, for example, FIGS. 10, 11, 12, and 13.

Figure 10:
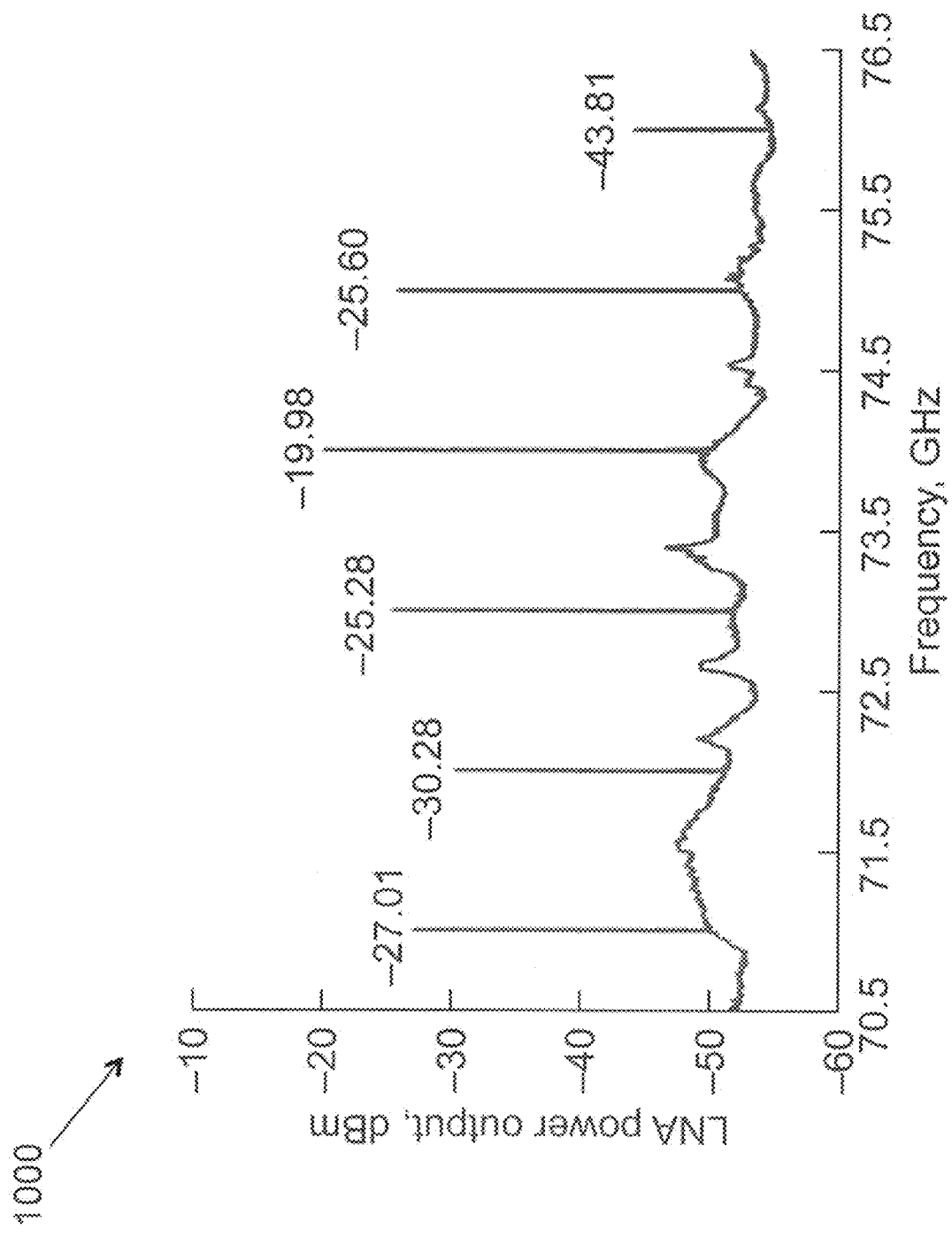
FIG. 10 is a graph illustrating E-band multi-tones at 1 GHz intervals or comb spacing as measured at the output of the low noise amplifier. The output power level for each tone is indicated in dBm.
Figure 11:
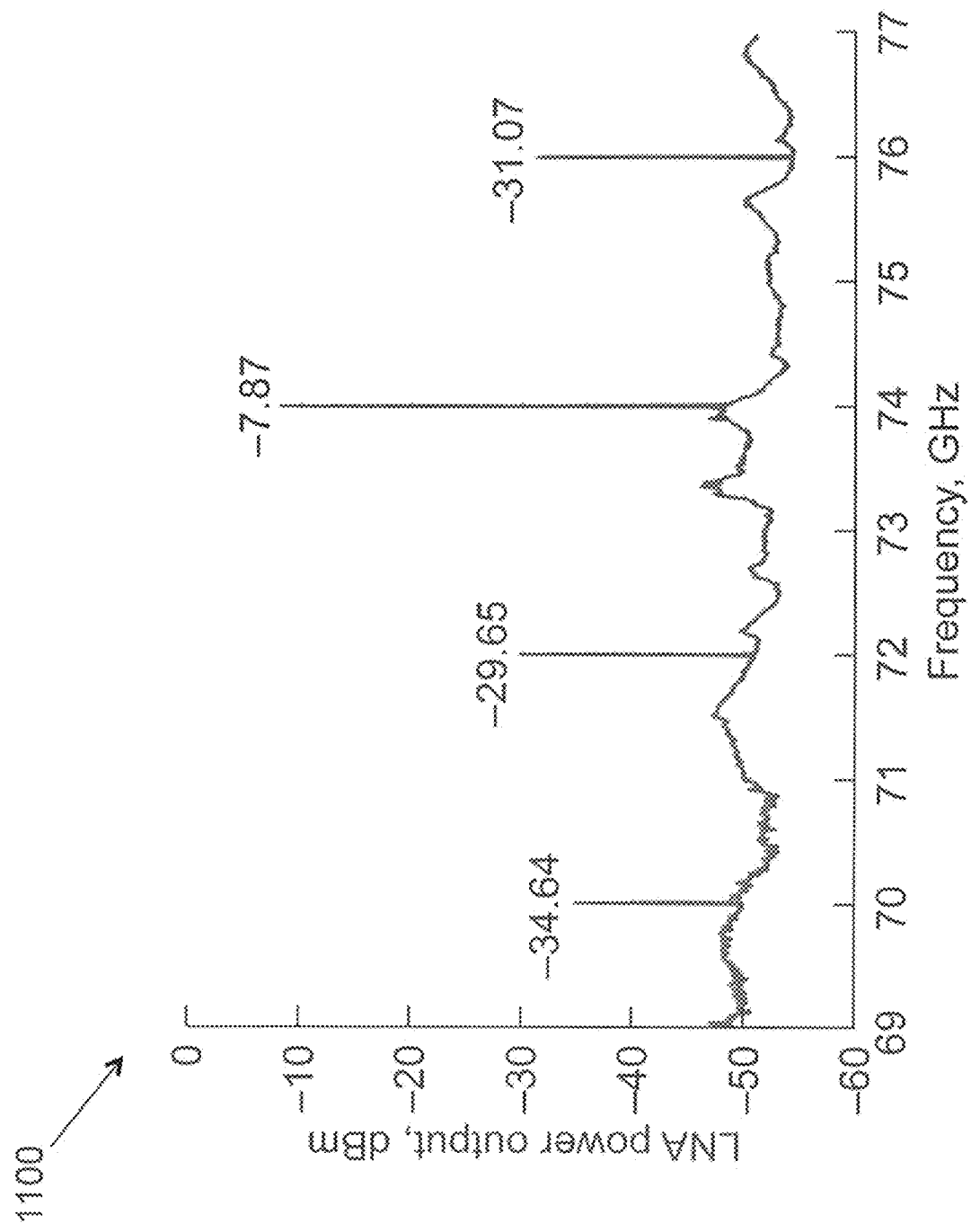
FIG. 11 is a graph illustrating E-band multi-tones at 2 GHz intervals or comb spacing as measured at the output of the low noise amplifier. The output power level for each tone is indicated in dBm.
Figure 12:
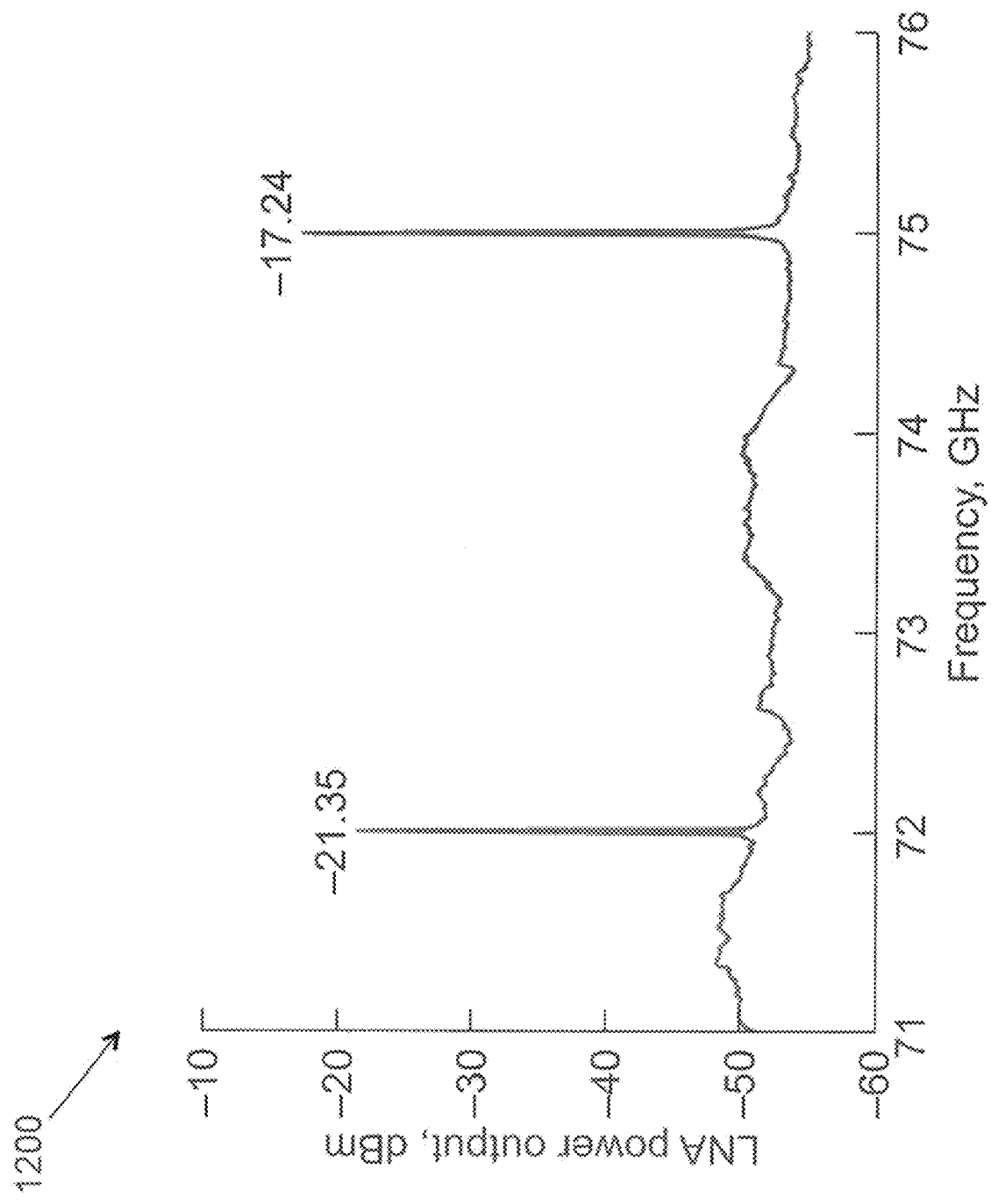
FIG. 12 is a graph illustrating E-band multi-tones at 3 GHz intervals or comb spacing as measured at the output of the low noise amplifier. The output power level for each tone is indicated in dBm.
Figure 13:
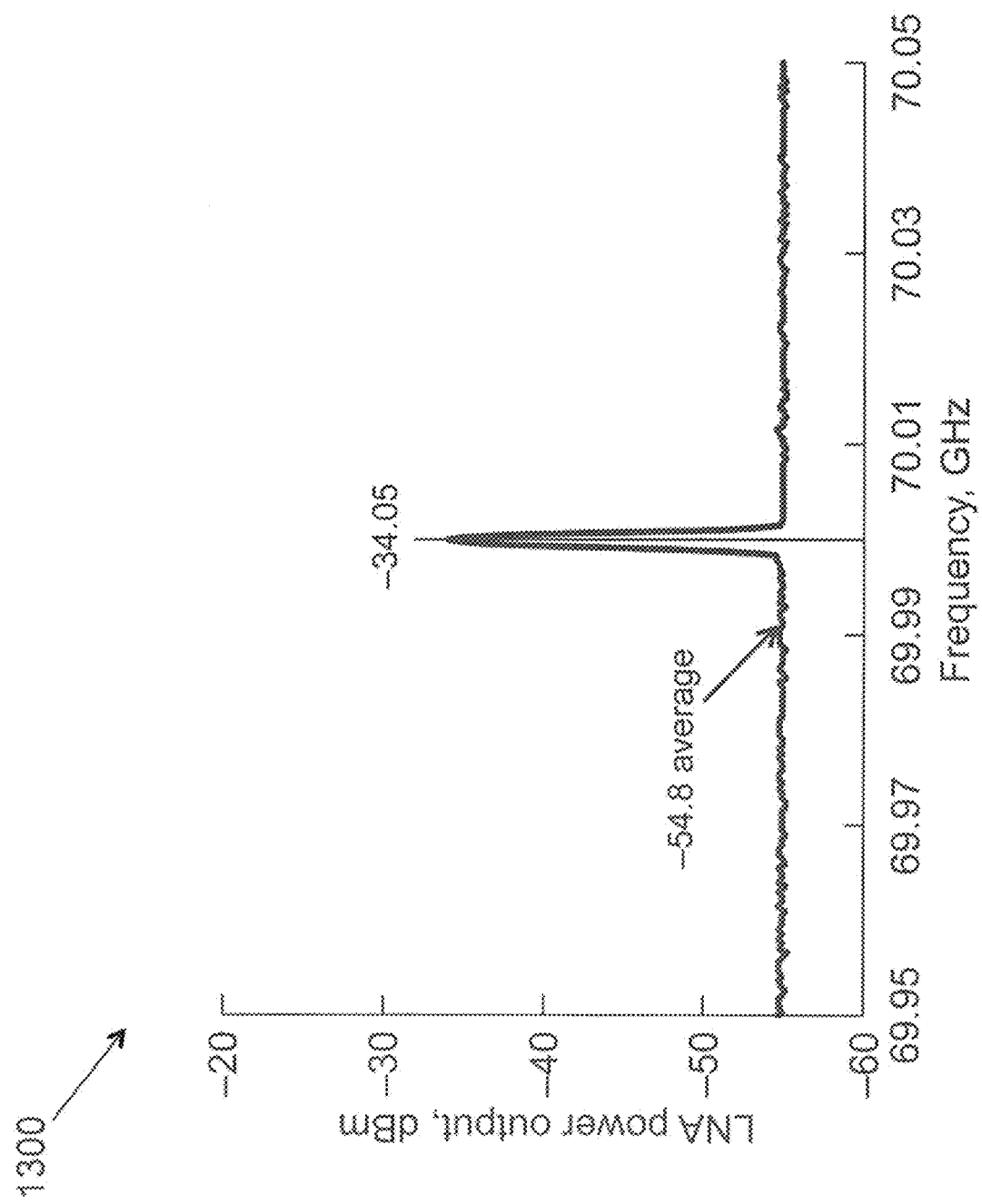
FIG. 13 is a graph illustrating the frequency spectrum of a single tone at E-band. The output power level for the tone and the noise floor are indicated in dBm.

In FIG. 10, graph 1000 shows the E-band multi-tones with 1.0 GHz separation or spacing between the tones and the tone frequency and output power level. In FIG. 11, graph 1100 shows the E-band multi-tones with 2.0 GHz separation or spacing between the tones and the tone frequency and output power level. In FIG. 12, graph 1200 shows the E-band multi-tones with 3.0 GHz separation or spacing between the tones and the tone frequency and output power level. In FIG. 13, graph 1300 shows the frequency spectrum of a single tone as an example of the quality at E-band. The tone output power level and the noise floor are also indicated. It should be appreciate by a person of ordinary skill in the art that the tone is very distinct and sharp with excellent signal-to-noise ratio. The linewidth of the tone close to the noise floor is on the order of few MHz indicating excellent spectral purity.

Figure 14:
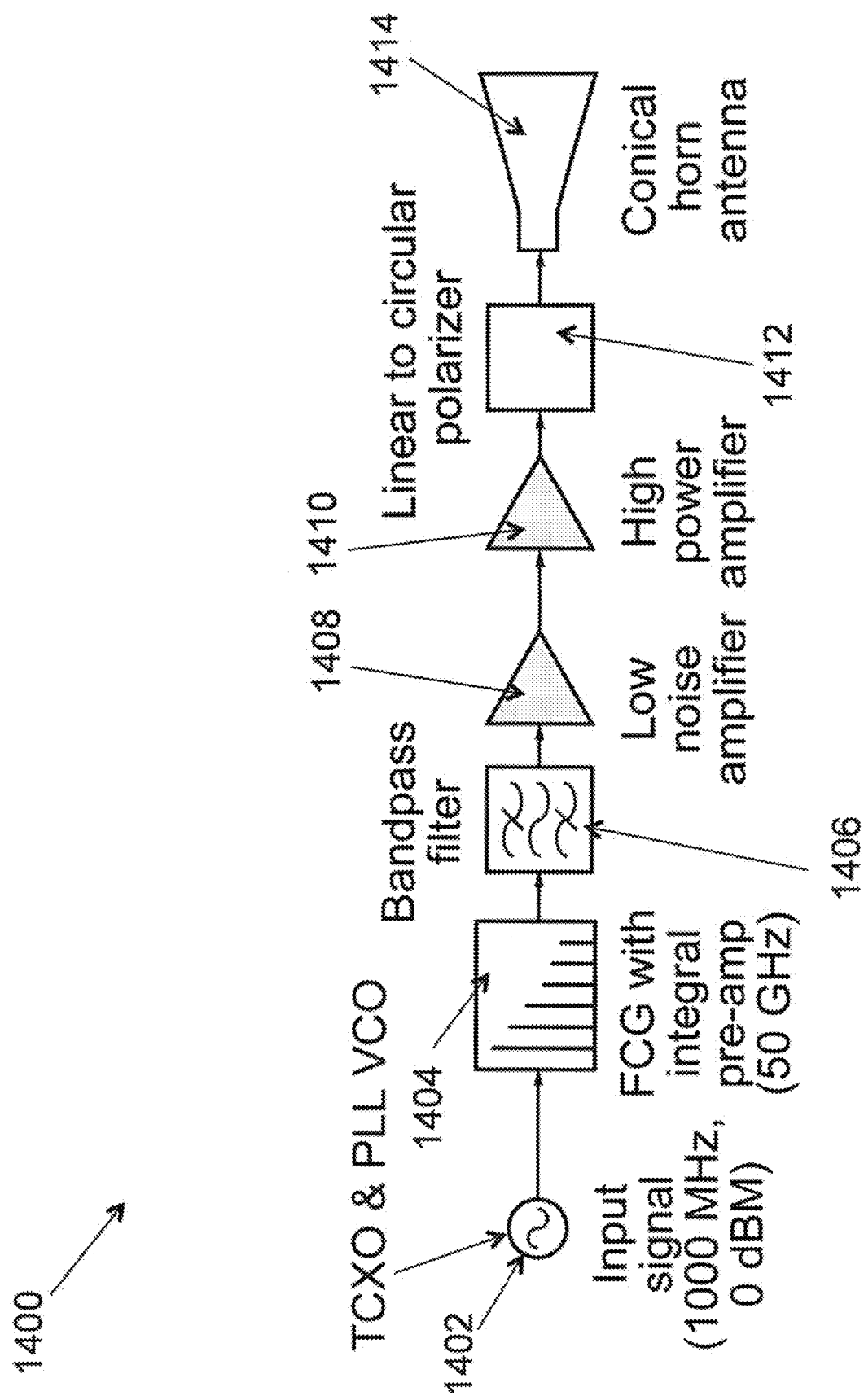
FIG. 14 is a schematic illustrating a basic tunable multi-tone millimeter-wave frequency synthesizer based beacon transmitter for a cube satellite (CubeSat).

FIG. 14 is a schematic 1400 illustrating an example of a tunable multi-tone millimeter-wave frequency synthesizer based beacon transmitter configured for a cube satellite (CubeSat) according to an embodiment of the present invention. In this embodiment, the separation or spacing between the tones can be tuned by changing the frequency of the input signal 1402 to the frequency comb generator (FCG) 1404. The bandpass filters 1406, amplifier chain 1408, high power amplifier 1410, polarizer 1412, and the conical horn antenna 1414 are appropriately selected for the desired frequency range in this embodiment of the invention. The frequency and output of the beacon transmitter in the configuration 1400 is tunable or reconfigurable by commanding the cube satellite (CubeSat) from a ground station.

Figure 15:
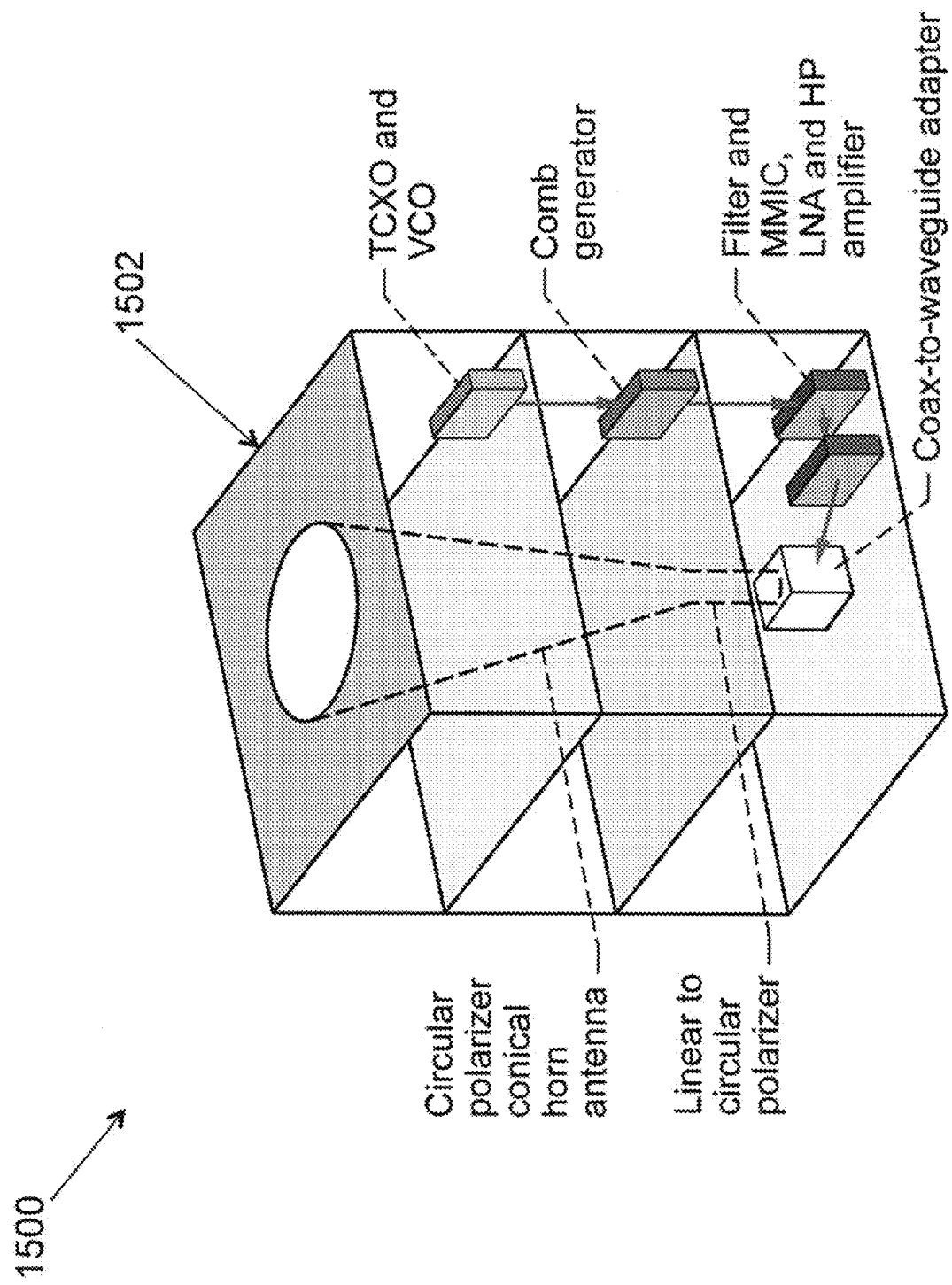
FIG. 15 is a schematic illustrating a tunable multi-tone millimeter-wave beacon transmitter payload integrated with a cube satellite (CubeSat) for space-to-ground radio wave propagation experiments. For simplicity, prime power conditioning and other control and commanding circuitry have been omitted.

FIG. 15 is a schematic 1500 illustrating the integration of a tunable multi-tone millimeter-wave frequency synthesizer based beacon transmitter payload with a cube satellite (CubeSat) 1502 for space-to-ground radio wave propagation experiments.

Figure 16:
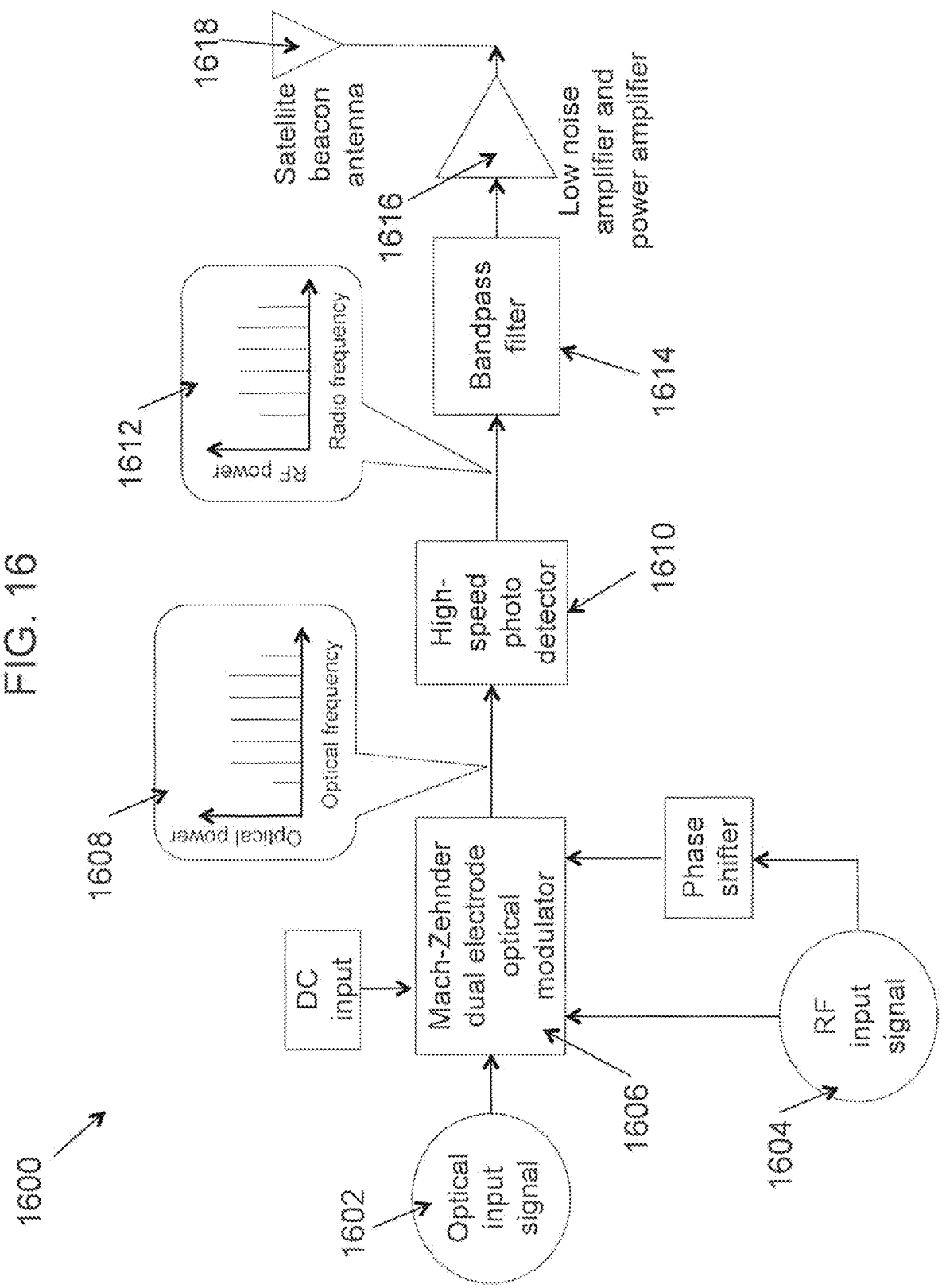
FIG. 16 is a schematic illustrating a tunable multi-tone multi-band millimeter-wave frequency synthesizer based on an optical frequency comb generator (FCG) and a high-speed photodiode for a beacon transmitter payload for radio wave propagation experiments.

FIG. 16 is a schematic 1600 illustrating a tunable multi-tone multi-band frequency synthesizer according to an embodiment of the present invention. In this embodiment, the input of the synthesizer consists of a Mach-Zehnder dual electrode optical modulator 1606, which receives input from an optical source such as a tunable laser source 1602 as well as from a tunable RF signal source 1604. The wavelength of the optical source 1602 is about 1550 nanometers and the frequency of the RF source 1604 is about 10 GHz. It would be appreciated by a person of ordinary skill in the art that the optical modulator could be manufactured from materials such as LiNbO3, III-V compound semiconductors, or silicon-organic hybrid. The drive voltage applied to the two RF electrodes of the modulator 1606 is sufficiently high to generate a 180 degrees phase shift within each individual arm of the modulator. As a consequence of the nonlinearity in the modulator the optical output from the modulator is an evenly spaced optical frequency comb spectra 1608, which are coherent and tunable by varying the frequency of the RF input signal 1604. In other words, the Mach-Zehnder modulator with the optical and RF inputs constitutes an optical frequency comb generator or harmonic generator or multi-tone generator. The output optical frequency comb spectra are next coupled to a high-speed photo detector 1610. The nonlinearity of the photodiode voltage-current characteristics generates beat signals and consequently the output of the photo detector is a coherent radio frequency comb spectra 1612 that includes all of the K-band, Q-band and E-band frequencies. The frequency of separation between the individual harmonics or tones can be tuned by varying the frequency of the RF input signal 1604. A person of ordinary skill in the art would appreciate that the photo detector physical structure could be either junction type such as PIN photodiode or Schottky-barrier photodiode or bulk type such as photoconductive metal-semiconductor-metal detector. Furthermore, it would be appreciated by a person of ordinary skill in the art that the material for manufacturing the photo detectors could include silicon, III-V compound semiconductors, and wide band gap semiconductors. A bandpass filter 1614 filters out the desired Q-band and E-band frequencies, which are amplified by a chain of low noise and power amplifiers 1616. The amplified multi-tone multi-band signals are transmitted through antenna 1618 from space to a ground receiving station for radio wave propagation studies. It should be appreciated by a person of ordinary skill in the art that the optical input signal source 1602 and the RF input signal source 1604, the center frequency and bandwidth of the bandpass filters 1614, the amplifier chain 1616 and the antennas 1618 could be electronically tuned or reconfigured on orbit to accommodate a change in the number and frequency of the harmonics or tones and also the desired beacon output power by commanding the satellite from ground. It should also be appreciated by a person of ordinary skill in the art that as an alternate embodiment the laser diode and the optical modulator could be manufactured from identical materials and thus could be integrated into a single device to improve reliability, reduce the size and mass, enhance efficiency, and lower the cost.

Figure 17:
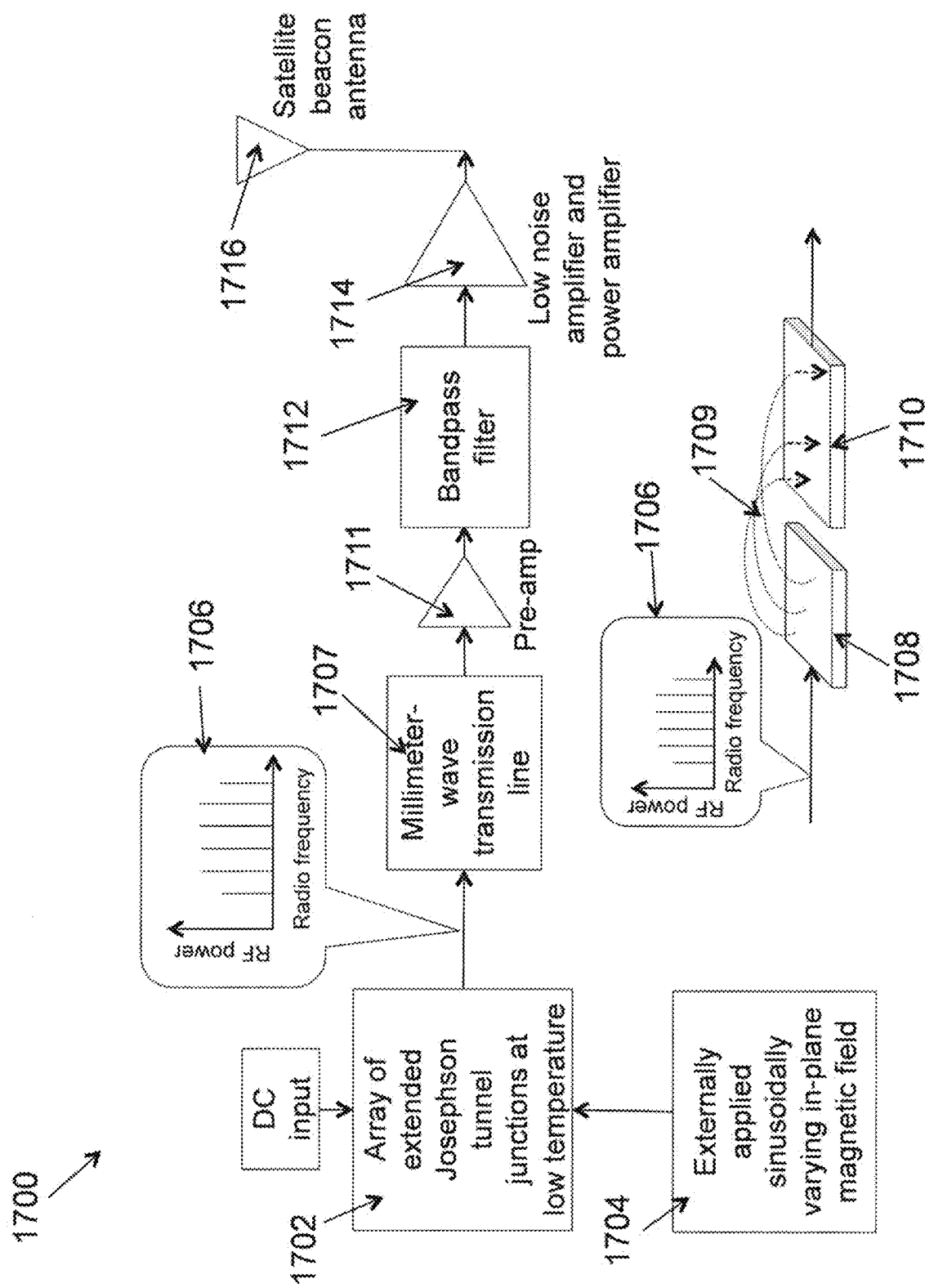
FIG. 17 is a schematic illustrating a tunable multi-tone multi-band millimeter-wave frequency synthesizer based on a low temperature superconducting frequency comb generator (FCG) and a millimeter-wave chip-to-chip interconnect through free-space for a beacon transmitter payload for radio wave propagation experiments.

FIG. 17 is a schematic 1700 illustrating a tunable multi-tone multi-band frequency synthesizer according to an embodiment of the present invention. In this embodiment, the input of the synthesizer consists of an array of extended Josephson tunnel junctions 1702 cooled to low temperature. In addition, a sinusoidally driven magnetic field 1704 is applied to the Josephson device array in the plane of the junction from an external source. The frequency of the applied sinusoidally driven magnetic field is about 100 MHz. It would appreciated by a person of ordinary skill that the Josephson junction devices could be manufactured from low-temperature superconductors such as niobium (Nb) or from high-temperature superconductor such as yttrium barium copper oxide (YBCO). In addition, the insulator between the superconductors in the Josephson junction devices could be aluminum oxide (AlOx). The emitted radiation spectrum 1706 of the Josephson junction devices contains evenly spaced hundreds of harmonics of the fundamental frequency of the driving magnetic field. These harmonics are coherent and the frequency of separation between the individual harmonics or tones can be tuned by varying the frequency of the externally applied sinusoidal magnetic field 1704. Next, the emitted radiation is coupled to a millimeter-wave transmission line 1707, which is cascaded with a pre-amplifier 1711. The pre-amplifier 1711 amplify the emitted radiation. The bandpass filter 1712 filters out the desired harmonic frequencies or tone. The power amplifier 1714 amplifies the filtered harmonics or tones to the desired output power. The beacon antenna 1716 transmits the amplified signal from a satellite to a ground receiving station.

As an alternate embodiment of the present invention, in place of the millimeter-wave transmission line 1707, an array of miniature printed or planar antennas on a chip 1708 could be integrated with the array of Josephson junction devices 1702. Then the emitted radiation 1709 from the chip 1708 could be proximity coupled via free space to a similar array of printed or planar antennas on a second chip 1710. The chip 1710 is integrated with the pre-amplifier 1711. The pre-amplifier 1711 amplify the emitted radiation. The bandpass filter 1712 filters out the desired harmonic frequencies or tone. The power amplifier 1714 amplifies the filtered harmonics or tones to the desired output power. The beacon antenna 1716 transmits the amplified signal from a satellite to a ground receiving station. The advantage of this alternate embodiment is that it provides excellent thermal isolation between the cooled superconducting Josephson junction device array and the rest of the signal processing circuitry, which does not require cooling. This configuration or approach reduces the overall thermal mass or load on the cooling apparatus used for cooling the Josephson device array 1702 and thereby enhances the overall system efficiency.

It would be appreciated by a person of ordinary skill in the art that the externally applied sinusoidally varying in-plane magnetic field 1704, the center frequency and bandwidth of the bandpass filter 1712, the amplifier chain 1714, and the antenna 1716 could be electronically tuned or reconfigured on orbit to accommodate a change in the number and frequency of the harmonics or tones and also the desired beacon output power by commanding the satellite from ground.

Some embodiments of the present invention pertain to a multi-tone multi-band tunable millimeter-wave synthesizer configured for space-borne beacon transmitter for atmospheric radio wave propagation studies. The apparatus includes a millimeter-wave frequency comb generator, which puts out evenly spaced harmonic frequencies of the input signal, which are coherent, tunable, and the number of tones or combs is scalable over a wide range of frequencies. An alternate embodiment includes an optical frequency comb generator and high-speed photo detector to generate the coherent and evenly spaced harmonics or tones of the input signal. Yet another embodiment includes a superconducting Josephson junction based frequency comb generator to generate the coherent and evenly spaced harmonics or tones of the input signal. These harmonics or tones are then amplified to the power level needed for radio wave propagation studies. The amplified signals are transmitted as beacon signals from a satellite to a ground receiving station for radio wave propagation studies.

It will be readily understood that the components of the invention, as generally described and illustrated in the figures herein, may be arranged and designed in a wide variety of different configurations. Thus, the detailed description of the embodiments is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with an embodiment may be included in at least one embodiment of the invention. Thus, appearances of the phrases "in certain embodiments," "in some embodiments," "in other embodiments," or other similar language, throughout this specification do not necessarily all refer to the same embodiment or group of embodiments, and the described features, structures, or characteristics may be combined in any suitable manner in one or more embodiments.

One having ordinary skill in the art will readily understand that the invention as discussed above may be practiced with steps in a different order, and/or with hardware elements in configurations that are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A transmitter comprising:
   an input signal configured to be frequency tuned by a user;
   a pre-amplifier configured to amplify the frequency tuned input signal;
   a frequency comb generator configured to receive the frequency tuned input signal and to simultaneously produce an output signal comprising a coherent evenly spaced comb of radio frequencies with tunable intervals at several frequency bands, wherein the coherent evenly spaced comb of radio frequencies is in at least one of the Q-band, the K-band, and the E-band;
   a power divider configured to receive the evenly spaced comb of radio frequencies and divide the output signal into a plurality of outputs;
   one or more than one tunable bandpass filters configured to select a user-selected band of comb radio frequencies from the plurality of outputs produced by the power divider;
   one or more than one tunable power amplifiers configured to simultaneously amplify the user-selected band of comb radio frequencies; and
   one or more than one transmission antennas configured to simultaneously transmit the user-selected band of comb radio frequencies from the one or more than one tunable power amplifiers to one or more than one receiving antenna.

2. The transmitter of claim 1, wherein the frequency comb generator is capable of generating multiple tones from the input signal.

3. The transmitter of claim 2, wherein the frequency comb generator is capable of generating harmonics of the input signal.

4. The transmitter of claim 3, wherein the one or more than one tunable bandpass filters are capable of selecting portions of the multiple tones or harmonics at K-band, Ka-band, Q-band, or E-band or simultaneously at two or more combinations of these bands.

5. The transmitter of claim 1, wherein the one or more than one tunable power amplifier is capable of amplifying the multiple tones or harmonics.

6. The transmitter of claim 1, wherein the one or more than one antenna is capable of transmitting the multiple tones or harmonics.

7. The transmitter of claim 1, wherein the frequency of the tunable input signal is commandable from the ground and reconfigurable to be equal to or greater than 10.0 MHz.

8. The transmitter of claim 1, wherein filter passband characteristics of the bandpass filter are tunable, commandable, and reconfigurable from ground.

9. The transmitter of claim 8, wherein the filter bandwidth is reconfigurable anywhere from 0.5 GHz to 8.0 GHz.

10. The transmitter of claim 1, wherein the amplifier at the output of the bandpass filter has a low noise stage followed by a medium power stage and a high power stage with gain and output power commandable from the ground and reconfigurable anywhere from small signal to saturation.

11. The transmitter of claim 2, wherein the transmitter transmission antenna is capable of simultaneously transmitting the user selected comb of frequencies or multiple tones at K-band, Ka-band, Q-band, or E-band or simultaneously at two or more combinations of these bands.

12. The transmitter of claim 1, wherein the transmitter transmission antenna is a reconfigurable beacon that transmits at least one frequency or tone at any one of the frequency bands.

13. The transmitter of claim 1, wherein the transmission antenna and the receiving antenna both can be on Earth, or both in orbit above the Earth, or one in each.

14. A transmitter comprising:
   an optical input signal and a radio frequency input signal configured to be frequency tuned by a user;
   a dual electrode Mach-Zehnder optical modulator configured to receive a DC input and both the optical input signal and the frequency tuned radio frequency input signal and to simultaneously produce coherent evenly spaced comb of optical frequencies;
   a high-speed photo detector configured to receive the produced comb of optical frequencies and to produce a coherent evenly spaced comb of radio frequencies, wherein the coherent evenly spaced comb of radio frequencies is in at least one of the Q-band, the K-band, and the E-band;
   a tunable bandpass filter configured to filter out a user-selected portion of the comb of radio frequencies, wherein the filter bandwidth is reconfigurable anywhere from 0.5 GHz to 8.0 GHz;
   a tunable amplifier configured to amplify the user-selected portion of the produced comb of frequencies;
   a tunable power amplifier configured to further amplify the user-selected portion of the produced comb of frequencies; and
   a transmission antenna configured to simultaneously transmit the produced comb of frequencies to a receiving antenna.

15. The transmitter of claim 14, wherein the wavelength of the input optical signal is equal to or greater than 1500 nanometers.

16. The transmitter of claim 14, wherein the frequency comb generator is capable of generating multiple tones or harmonics.

17. The transmitter of claim 14, wherein the bandwidth of the high speed photo detector is equal to or greater than 100 GHz.

18. The transmitter of claim 14, wherein the photo detector is capable of producing coherent evenly spaced comb of radio frequency multiple tones or harmonics.

19. The transmitter of claim 14, wherein filter passband characteristics of the bandpass filter are tunable, commandable, and reconfigurable from ground.

20. The transmitter of claim 17, wherein the amplifier at the output of the bandpass filter has a low noise stage followed by a medium power stage and a high power stage with gain and output power commandable from the ground and reconfigurable anywhere from small signal to saturation.

* * * * *